(12) United States Patent
Zebedee et al.

(10) Patent No.: US 7,619,553 B2
(45) Date of Patent: Nov. 17, 2009

(54) DIGITAL-TO-ANALOGUE CONVERTER

(75) Inventors: Patrick Zebedee, Headington (GB); Jeremy Lock, Witney (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/665,857

(22) PCT Filed: Oct. 21, 2005

(86) PCT No.: PCT/JP2005/019844
§ 371 (c)(1),
(2), (4) Date: Feb. 2, 2009

(87) PCT Pub. No.: WO2006/043732
PCT Pub. Date: Apr. 27, 2006

(65) Prior Publication Data
US 2009/0153383 A1 Jun. 18, 2009

(30) Foreign Application Priority Data
Oct. 22, 2004 (GB) ................................. 0423397.9

(51) Int. Cl.
*H03M 1/66* (2006.01)
(52) U.S. Cl. ...................................... 341/150; 341/144
(58) Field of Classification Search .......... 341/150–170
See application file for complete search history.

(56) References Cited

U.S. PATENT DOCUMENTS 4,611,195 A 9/1986 Shosaku
7,061,418 B2 * 6/2006 Zebedee ..................... 341/150

FOREIGN PATENT DOCUMENTS

GB 2409777 7/2005

OTHER PUBLICATIONS

International Search Report (PCT/ISA/210) and (PCT/ISA/220), 2005.

* cited by examiner

*Primary Examiner*—Lam T Mai
(74) *Attorney, Agent, or Firm*—Harness, Dickey & Pierce, P.L.C.

(57) ABSTRACT

A digital-to-analogue conversion arrangement is disclosed which includes first and second groups of the same number of bi-directional bufferless digital-to-analogue converters. The output of at least one converter in each group is connected to a respective capacitive load ($C_{LOAD}$, $C_{LOAD'}$). During a calibration phase of operation the converter inputs receive first and second different codes representing the same output level. The arrangement also includes a respective switched capacitor network connected to each converter output, a comparator for comparing the output voltages of the first and second groups, and a control circuit. The control circuit controls the capacitor networks in response to the comparator so as to make the output voltages of the first and second groups substantially equal.

25 Claims, 16 Drawing Sheets

DIGITAL-TO-ANALOGUE CONVERTER

TECHNICAL FIELD

The present invention relates to a digital-to-analogue converter, and to a display including such a converter. Such a converter may be used, for example, for driving matrix columns of a liquid crystal display. A particular application of such a converter is in small display panels for portable applications where power consumption is at a premium.

BACKGROUND ART

FIG. 1 of the accompanying drawings illustrates a known type of switched capacitor digital/analogue converter (DAC) for converting an input n-bit digital code to a corresponding analogue voltage output. The digital-to-analogue converter comprises n-capacitors $C_1, \ldots, C_n$ with the capacitance $C_i$ of each $i^{th}$ capacitor preferably being equal to $2^{(i-1)} C_1$. The DAC further comprises a terminating capacitor $C_{TERM}$ connected between the input of a unity gain buffer 1 and ground. The first electrodes of the capacitors $C_1, \ldots, C_n$ are connected together and to the first terminal of the terminating capacitor $C_{TERM}$. The second terminal of each of the capacitors $C_1, \ldots, C_n$ is connected to a respective switch, such as 2, which selectively connects the second electrode to a first or second reference voltage input $V_1$ or $V_2$ in accordance with the state or value of a corresponding bit of the input code. The output of the buffer 1 drives a capacitive load $C_{LOAD}$, for example in the form of a data line or column electrode of an active matrix of a liquid crystal device.

The DAC has two phases of operation, namely a resetting or "zeroing" phase and a converting or "decoding" phase, controlled by timing signals which are not illustrated in FIG. 1. During the zeroing phase, the first and second electrodes of the capacitors $C_1, \ldots, C_n$ and the first electrode of the terminating capacitor $C_{TERM}$ are connected together, and to the first reference voltage input $V_1$ by an electronic switch 3. The capacitors $C_1, \ldots, C_n$ are therefore discharged so that the total charge stored in the DAC is equal to $V_1 C_{TERM}$.

During the decoding phase, the second electrode of each capacitor $C_i$ is connected to the first reference voltage input $V_1$ or to the second reference voltage input $V_2$ according to the value of the $i^{th}$ bit of the input code. The charge stored in the DAC is given by:

$$Q = \sum_i b_i C_i (V_{DAC} - V_2) + \sum_i (1-b_i) C_i (V_{DAC} - V_1) + V_{DAC} C_{TERM} \quad (1)$$

where $b_i$ is the $i^{th}$ bit of the input code and $V_{DAC}$ is the voltage at the first electrodes of the capacitors $C_1, \ldots, C_n$ and $C_{TERM}$. The output voltage is therefore given by:

$$V_{DAC} = V_{OUT} = \frac{\sum_i b_i C_i}{\sum_i C_i + C_{TERM}} (V_2 - V_1) + V_1 \quad (2)$$

In general, $C_i = 2^{(i-1)} C_1$ and $C_1 = C_{TERM}$. This results in a set of output voltages which are linearly related to the input digital word.

The unity gain buffer 1 is provided in order to isolate the load capacitance from the DAC and to prevent it from affecting the conversion process. However, such buffers are a substantial source of power consumption, and in many applications it is desirable to eliminate the unity gain buffer 1. If the buffer 1 were to be omitted, the terminating capacitance would be increased by the addition of the load capacitance so that the maximum output voltage from the DAC would be given by:

$$V_{OUT(MAX)} = \frac{\sum_i C_i}{\sum_i C_i + C_{TERM} + C_{LOAD}} (V_2 - V_1) + V_1 \quad (3)$$

Another example of a digital-to-analogue converter is a "bi-directional" digital-to-analogue converter, an example of which is shown in FIG. 2. The bi-directional DAC 32 of FIG. 2 includes a switched-capacitor digital-to-analogue converter having the general structure shown in FIG. 1, indicated schematically as component 4 in FIG. 2.

The converter is an n-bit converter, where n is an integer greater than one, and comprises an (n−1) bit bufferless switched capacitor converter 4 having first and second reference voltage inputs, labelled as $V_1$ and $V_2$ in FIG. 2, and an (n−1) bit digital input. An (n−1) bit selective inverter is provided for supplying to the (n−1) bit digital input the (n−1) least significant bits of an input code without inversion when the most significant bit (MSB) of the input code has a first value and with inversion when the most significant bit of the input code has a second value different from the first value. The (n−1) least significant bits of the input code are input to the switched-capacitor DAC 4 via selector switches 31 that can select either the bit or the inverted bit. The selector switches 31 are controlled by the most significant bit of the input code.

Each converter also has a switching arrangement for connecting the first and second reference voltage inputs to receive first and second reference voltages, respectively, when the most significant bit of the input code has the first value and to receive the second and first reference voltages respectively, when the most significant bit of the input code has the second value. Two different voltages $V_H, V_L$ are input to the converter 4 of FIG. 2. The voltage input to the switched-capacitor digital-to-analogue converter 4 as the first reference voltage $V_1$ can be set to be either $V_H$ or $V_L$ by means of a selector switch 30, and the voltage input to the switched-capacitor digital-to-analogue converter 4 as the second reference voltage $V_2$ can be set to be either $V_L$ or $V_H$ by means of another selector switch 30'. The selector switches 30, 30' are controlled by the most significant bit (MSB) of the input code.

The unity-gain buffer 1 of FIG. 1 is omitted from the switched capacitor DAC 4 in the circuit of FIG. Accordingly, the term $C_{TERM}$ in equation (3) is replaced by $C_{LOAD}$.

The DAC of FIG. 2 is designed to operate with $$\sum_i C_i = C_{TERM}.$$

Its operation is summarised in FIG. 3, and is as follows.

FIG. 3 shows the output voltage of the digital-to-analogue converter 32 of FIG. 2 as a function of the input code, for a case where the internal capacitance of the switched DAC 4 is equal to the load capacitance $C_{LOAD}$. When the most significant bit of the input code is equal to zero, voltage $V_L$ is input to the switched-capacitor DAC 4 as the first reference voltage $V_1$, and voltage $V_H$ is input as the second reference voltage $V_2$. The (n−1) least significant bits $b_{n-1} \ldots b_1$ are not inverted. The analogue output of the DAC increases from an output of $V_L$ (for an input code of 00 . . . 00) to an output voltage of ½ ($V_L+V_H$) as the input code increases to 011 . . . 11. This is represented by the lower portion (or "arm") of the output characteristic shown in FIG. 3, labelled "MSB=0".

When the most significant bit of the input digital data is 1, the voltage $V_H$ is input to the switched capacitor DAC 4 as the first reference voltage $V_1$, whereas the voltage $V_L$ is input as the second reference voltage $V_2$. The (n−1) least significant bits are inverted by means of an inverting amplifier 5 before being input to the switched capacitor DAC 4. The analogue output voltage has a value $V_H$ for an input code of 11 . . . 11, and the output voltage decreases to ½ ($V_L+V_H$) as the input data decreases (that is, as the inverted least significant bit data increases) this is represented by the upper arm of the output characteristic shown in FIG. 3 (labelled "MSB=1").

In FIG. 3, the two arms of the output meet at the Midpoint—that is, the output voltage for an input code of 011 . . . 11 is equal to the output voltage for an input code of 100 . . . 00.

The circuit of FIG. 2 is therefore known as a "bi-directional" DAC, because of the form of its output voltage characteristic shown in FIG. 3.

For correct operation of a bi-directional DAC, the internal capacitance of the switched capacitance DAC 4 must equal the load capacitance. However, while the internal capacitance of the switched capacitance DAC 4 can be well-controlled at the design stage, in many applications the load capacitance may not be precisely known, or the load capacitance may be subject to manufacturing tolerances so that its actual value may be different from its design value, or the value of the load capacitance may vary during operation. FIGS. 4 and 5 show the effect of a mis-match between the internal capacitance of the switched capacitance DAC 4 and a load capacitance.

FIG. 4 shows the output characteristic for a case where the internal capacitance of the switched capacitance DAC 4 ($C_{DAC}$) is greater than the load capacitance. In this case, some output voltages are duplicated, such that two input data codes correspond to the same output voltage. In FIG. 4, for example, input data codes $D_1$ and $D_2$ (where $D_1$ is not equal to $D_2$) both produce the same output voltage of ½ ($V_L+V_H$).

Conversely, FIG. 5 shows the output characteristic for a case where $C_{DAC}<C_{LOAD}$. In this case, a range of output voltages do not correspond to any input data word. In FIG. 5, for example, no input codes will give an output voltage between $V_1$ and $V_2$. An output voltage can lie only in the voltage range between $V_L$ and $V_1$ or the voltage range between $V_2$ and $V_H$.

Acknowledgement of the Prior Art

JP-A-11 027 147 describes a method of tuning the characteristics of one DAC to match the characteristics of another DAC (which is assumed to have the "correct" characteristics). It does not, however, address the problem of matching the internal capacitance of a DAC to an external load capacitance.

DISCLOSURE OF THE INVENTION

The present invention provides a digital-to-analogue conversion arrangement comprising: first and second groups of the same number of bi-directional bufferless digital-to-analogue converters, each group comprising at least one converter whose output is connected to a respective capacitive load, the converter inputs being arranged, during a calibration phase of operation, to receive first and second different codes representing the same output level; a respective switched capacitor network connected to each converter output; a comparator for comparing the output voltages of the first and second groups; and a control circuit for controlling the capacitor networks in response to the comparator so as to make the output voltages of the first and second groups substantially equal.

The invention thus provides a converter arrangement which corrects any mismatch between the load capacitance and the internal capacitance of the digital-to-analogue converter. This may be done by varying the effective load capacitance experienced by the digital-to-analogue converter, by controlling the switched capacitor networks, until it is equal to the internal capacitance of the digital-to-analogue converters.

According to the present invention, two or more digital-to-analogue converters are compared to one another. This removes the need to generate an accurate reference level, and thus make the tuning process independent of process variation or operating conditions.

By the term "bi-direction digital-to-analogue converter" as used herein is meant a digital-to-analogue converter having an output characteristic of the general form shown in FIG. 3 (or in FIGS. 4 and 5 if the internal capacitance of the DAC is not correctly matched to the load capacitance).

By the term "bufferless digital-to-analogue converter" as used herein is meant a DAC in which the output buffer amplifier 1 having unity gain of FIG. 1 is not present.

The converters may be substantially identical.

The capacitive loads may be of substantially the same capacitance.

The second code may be the binary complement of the first code.

The same output level may be the middle scale level of the converters.

The control circuit may comprise a counter. The counter may be preloadable.

The control circuit may comprise a successive approximation register.

Each of the first and second groups may comprise one converter. Alternatively, each of the first and second groups may comprise a plurality of converters whose outputs are connected together during the calibration phase.

Each of the capacitor networks may be binary weighted.

The comparator may have inputs connected to the first and second groups via respective sample-and-hold circuits.

The capacitor networks may be connectable to a latch for a manual calibration mode.

Each of the converters may be a switched capacitor converter.

Each of the converters may have a total capacitance greater than that of the respective load. Each of the converters may have a total capacitance greater than that of the respective load at the start of the calibration, and the effective load capacitance of each converter is increased during the calibration phase so as to be made substantially equal to the capacitance of the converter.

Each of the converters may be an n-bit converter, where n is an integer greater than one, comprising: an (n−1) bit bufferless switched capacitor converter having first and second voltage inputs and an (n−1) bit digital input; and (n−1) bit selective inverter for supplying to the (n−1) bit digital input the (n−1) least significant bits without inversion when the most significant bit has a first value and with inversion when the most significant bit has a second value different from the first value; and a switching arrangement for connecting the first and second reference voltage inputs to receive first and second reference voltages, respectively, when the most significant bit has the first value and to receive the second and first reference voltages respectively, when the most significant bit has the second value.

The (n−1) bit converter may comprise (n−1) capacitors whose first electrodes are connected together for connection to the capacitive load.

The second electrode of each $i^{th}$ capacitor is arranged to be connected to the first or second reference voltage input when the $i^{th}$ bit of the (n−1) least significant bits has the first or second value, respectively.

The (n−1) bit converter may have a resetting mode in which the first and second electrodes of the capacitors are connected to the first reference voltage input.

Each $i^{th}$ capacitor may have a value $C_i$ given by $C_i = a^{(i-1)} C_1$ for $1 < i \leq (n-1)$, where a is a positive real number. The coefficient a may satisfy a=2.

The first value may be 0.

The second reference voltage may be greater than the first reference voltage.

A second aspect of the present invention provides an active matrix display comprising an arrangement as defined above, in which each of the loads comprises a data line and a pixel.

The display may comprise a liquid crystal device.

BRIEF DESCRIPTION OF THE DRAWINGS

Preferred embodiments of the present invention will be described by way of specific example with reference to the accompanying figures in which.

BEST MODE FOR CARRYING OUT THE INVENTION

Figure 1:
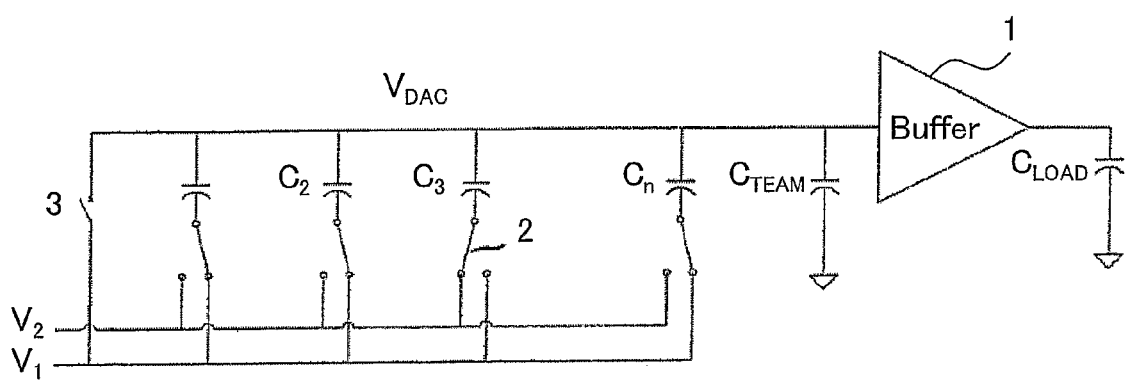
FIG. 1 is a block schematic view of a known digital-to-analogue converter.
Figure 2:
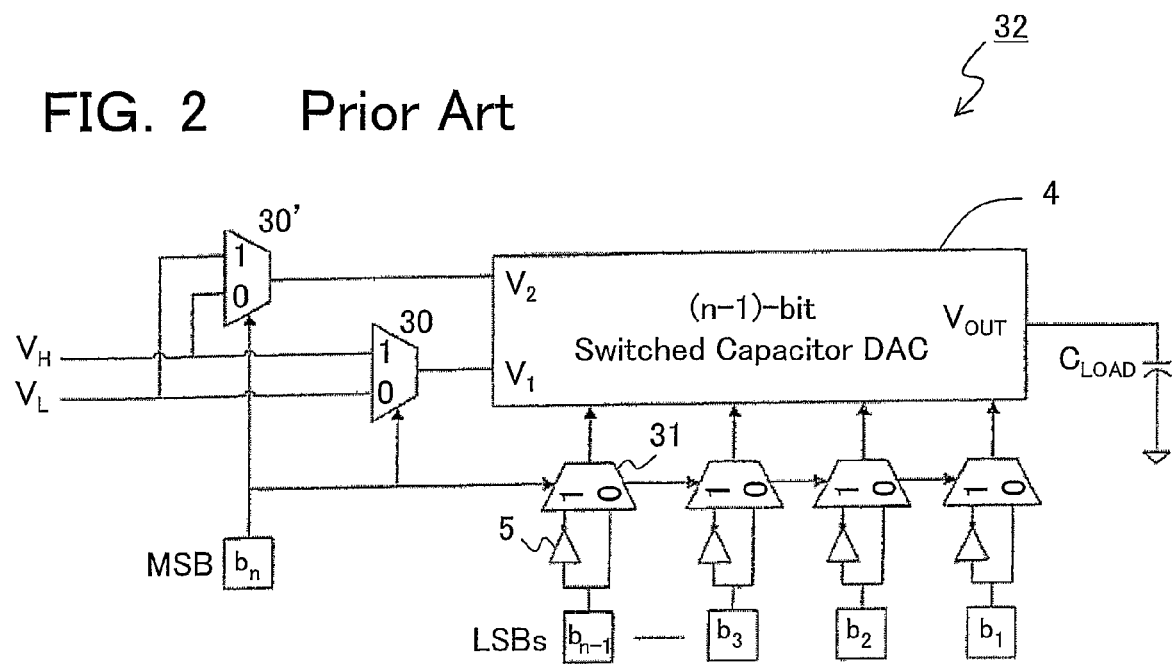
FIG. 2 is a schematic block diagram of a bi-directional digital-to-analogue converter.
Figure 6:
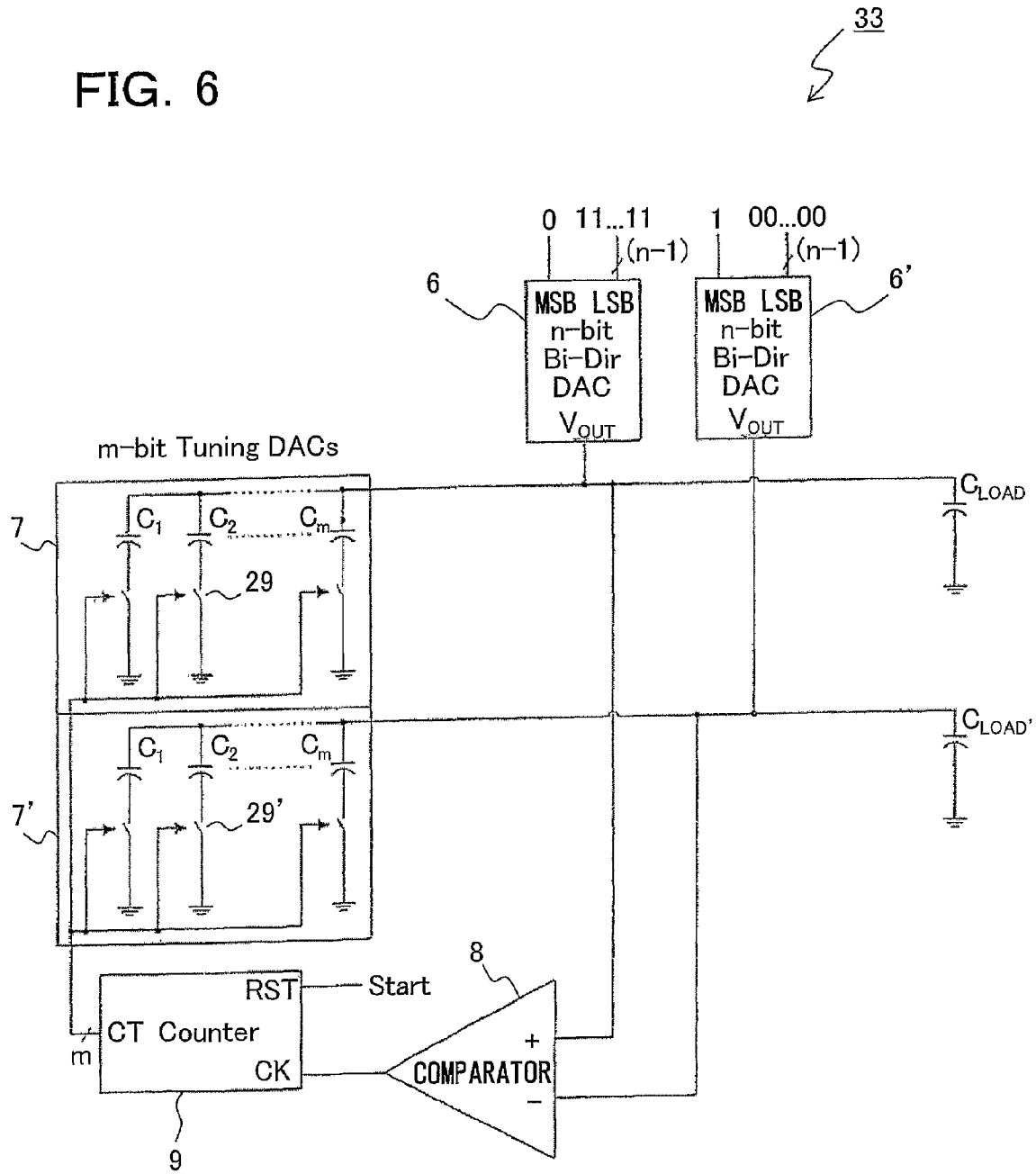
FIG. 6 is a block schematic diagram of a digital-to-analogue converter according to a first embodiment of the present invention.

FIG. 6 is a block schematic diagram of a digital-to-analogue converter arrangement 33 according to a first embodiment of the present invention. The arrangement comprises first and second groups of bi-directional bufferless digital-to-analogue converters 6,6'. Each converter 6,6' may be, for example, a switched capacitor converter and have the general form of the bi-directional bufferless converter of FIG. 2. Each group contains the same number of bufferless bi-directional digital-to-analogue converters 6,6'; in the embodiment of FIG. 6 each group contains one converter, although the invention is not limited to groups of only one converter.

The output of each digital-to-analogue converter 6,6' is connected to a respective capacitive load. The output of the first converter 6 is connected to a first capacitive load $C_{LOAD}$, and the output of the second converter 6' is connected to a second capacitive load $C_{LOAD'}$.

The converter arrangement 33 of FIG. 6 further comprises first and second switched capacitor networks 7, 7'. The first switched capacitor network 7 is connected to the output of the first converter 6, and the output of the second capacitor network 7' is connected to the output of the second converter 6'. The capacitive load $C_{LOAD}$, $C_{LOAD'}$ and the switched capacitor network 7,7' therefore both contribute to the overall effective load experienced by a converter 6,6'. The capacitor networks 7, 7' each comprise a set of m capacitors $C_1, C_2, \ldots C_m$. Each capacitor in a switched capacitor network 7,7' is provided with a respective switch 29,29' which selectively connects the capacitor to the output from the capacitor network.

The converter arrangement further comprises a comparator 8. The comparator is provided to compare the output from one converter 6 with the output from the other converter 6'. The output from one converter 6 is connected to the + input of the comparator and the output of the other converter 6' is connected to the − input of the converter. The comparator is arranged to give a logic 1 state at its output if $V_+$ is greater than $V_-$ (where $V_+$ denotes the input voltage at the +input terminal and $V_-$ denotes the input voltage at the − input terminal). Otherwise, the comparator outputs a logic 0 state.

The converter arrangement of FIG. 6 further comprises a control circuit for controlling the switched capacitor networks 7, 7' on the basis of the output of the comparator 8. In the embodiment of FIG. 6, the control circuit comprises a counter 9. The output from the comparator 8 is connected to the clock input CK of the counter 9. The Counter is an m-bit (or higher) counter. The switches 29,29' of the capacitor networks are controlled by the output from the counter 9, such that the capacitor $C_1$ is connected to the output of the capacitor network (by closing the respective switch) when there is a logic state "1" on the least significant bit of the counter output, the next capacitor $C_2$ is connected to the output of the capacitor network when there is a logic state "1" on the second bit of the counter output, and so on.

The capacitors of the capacitor networks 7, 7' may be binary-scaled capacitors. They may be arranged such that $C_i = a^{(i-1)} C_1$, where a is a positive constant coefficient. The coefficient a may, for example, be equal to 2 so that the value of each capacitor is twice the value of an immediately preceding capacitor.

The counter 9 has a second input RST. This is a reset input that resets the output of the counter to 00 . . . 00.

The outputs of the capacitor networks 7, 7' are connected to the load capacitance of the respective DAC 6, 6'. Thus, as capacitors in a capacitor network 7, 7' are connected to the output of the network under the control of the control circuit, the effect is to increase the effective load capacitance of the respective DAC 6, 6'.

In a preferred embodiment of the invention, the internal capacitance of each bi-directional, bufferless digital-to-analogue converters 6, 6' is set to be larger than the largest possible value of the respective load capacitance $C_{LOAD}$, $C_{LOAD'}$. The initial output characteristic of each DAC 6, 6' therefore will be similar to that shown in FIG. 4. The effective load capacitance is then increased in a calibration phase of operation, by selectively "switching in" capacitors of the capacitor network 7, 7' so as to connect them to the load capacitance. At the end of the calibration phase, the effective load capacitance is equal, or approximately equal, to the internal capacitance of the DAC, so that the output characteristic of each converter 6,6'. has the form shown in FIG. 3.

The calibration operation may take place at "power-on" when the converter arrangement 33 is switched on. The calibration process may additionally or alternatively be performed at intervals during operation, for example to correct for any variation of the loads with ambient temperature.

The calibration phase of operation is described with reference to FIG. 7.

Initially, a re-set pulse is applied to the RST input of the counter 9, to set the counter output to 00 . . . 00. All capacitors of each capacitor network 7, 7' are therefore disconnected from the respective load capacitors, since the switch 29,29' associated with every capacitor of each capacitor network will be open.

Figure 3:
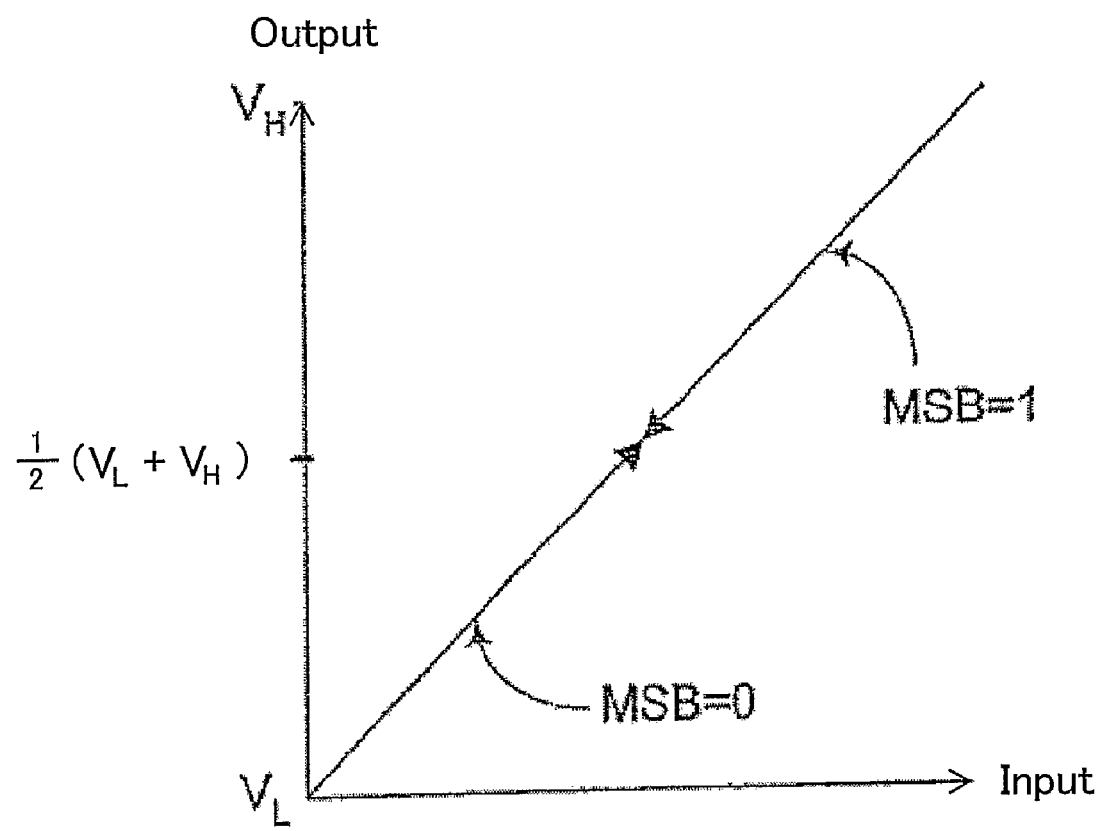
FIG. 3 illustrates the operation of the bi-directional digital-to-analogue converter of FIG. 2.

The codes input to the two converters 6, 6' during the calibration phase are chosen to be codes that should cause the two converters to give equal outputs if the converters were correctly calibrated and had the output characteristic of FIG. 3. In principle, the codes input to the two converters 6, 6' during the calibration phase may be any two codes that give the same expected out put voltage. However, the resultant system will be tuned so that the codes input to the two converters 6, 6' during the calibration phase correspond to the middle scale voltage of the converters (that is, to ½ ($V_H$+$V_L$)). The resolution of the tuned system would therefore be reduced if the codes input to the two converters 6, 6' during the calibration phase were not the codes that give the middle scale voltage of the converters as the expected output voltage. Some pairs of input codes would correspond to the same output voltage (in a similar manner to FIG. 4), and the capacitance of the capacitor networks 7,7' would be required to be much greater than the load capacitance $C_{LOAD}$. The codes input to the two converters 6, 6' during the calibration phase are therefore preferably the two codes that give the middle scale voltage of the converters as the expected output voltage—so preferably the first converter 6 would have the input code 011 . . . 11, and the input code to the second converter 6 is the binary complement 100 . . . 00. In this case, the expected output voltage from each converter is the middle scale voltage of the converters.

Figure 7:
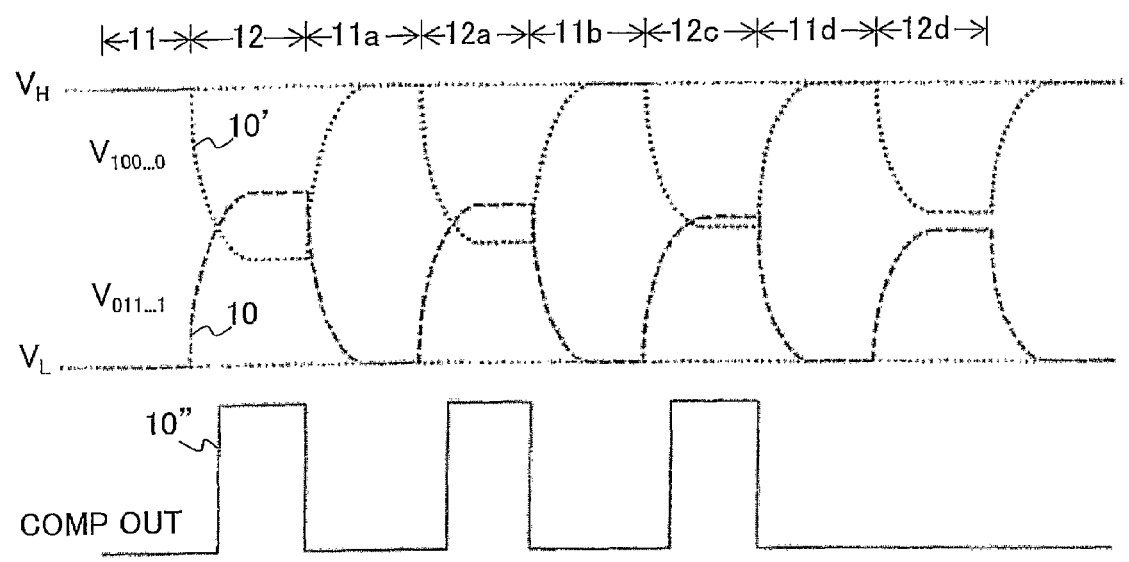
FIG. 7 illustrates the operation of the circuit of FIG. 6.

The first stage 11 of FIG. 7 is a zeroing phase. In this zeroing phase, the first converter 6 having input code 011 . . . 111 will produce as an output a voltage level $V_L$, and the converter 6' having an input code 100 . . . 00 will produce as its output a voltage level $V_H$. In FIG. 7, the output of the first converter 6 having input 011 . . . 11 is shown as a broken line 10 and the output from the second converter 6' having input code 100 . . . 00 is shown as a dotted line 10'.

During the zeroing phase 11, the + input of the comparator 8 sees a voltage $V_L$, and the − input to the comparator sees a voltage $V_H$. Since the comparator is arranged to give a logic 1 state at its output if $V_+$ is greater than $V_−$ and otherwise to output a logic 0 state, the output from the comparator 8 in the zeroing phase 11 is a logic 0 signal (since $V_+$(=$V_L$) is less than $V_−$ (=$V_H$)). The output from the comparator is shown as the full line 10 in FIG. 7.

Since the output of the comparator is logic 0, the counter does not advance during the zeroing phase 11.

Figure 4:
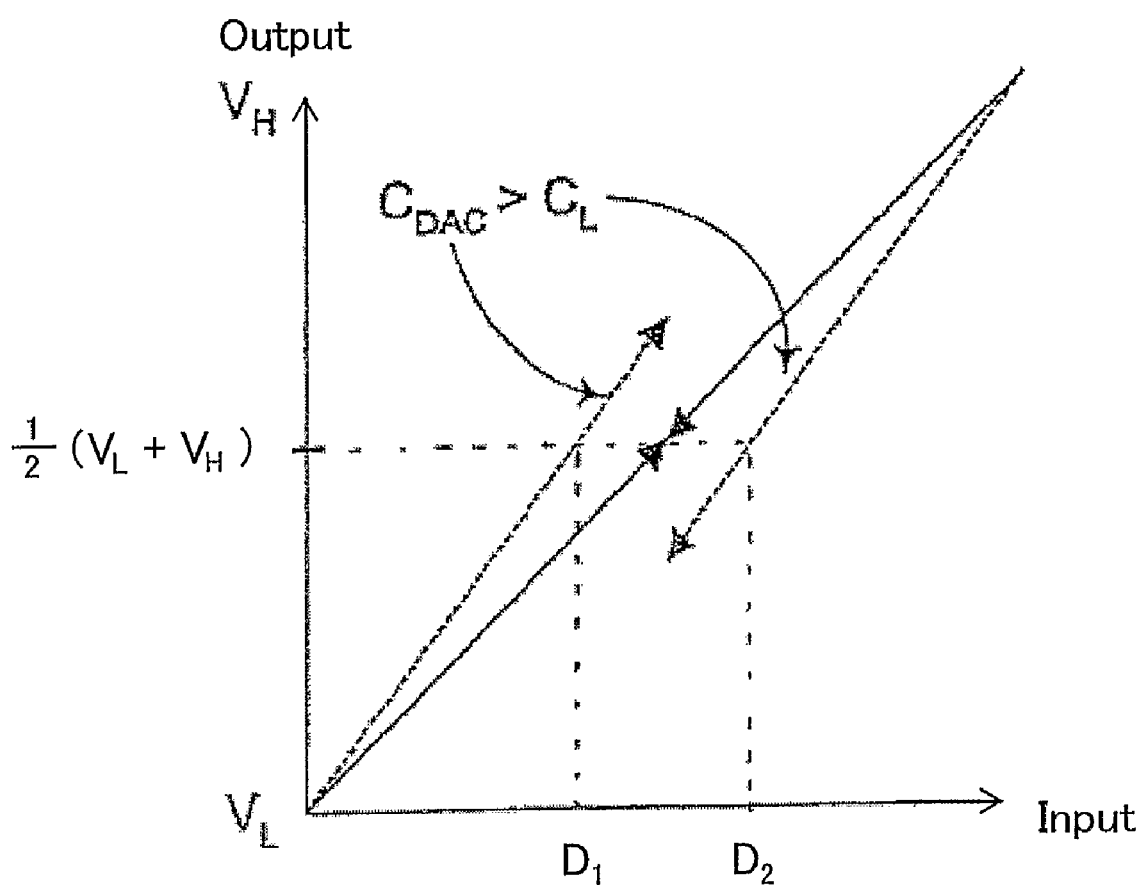
FIGS. 4 and 5 illustrate the effect of mis-match between the load capacitance and the internal capacitance of the digital-to-analogue converter of FIG. 2.
Figure 5:
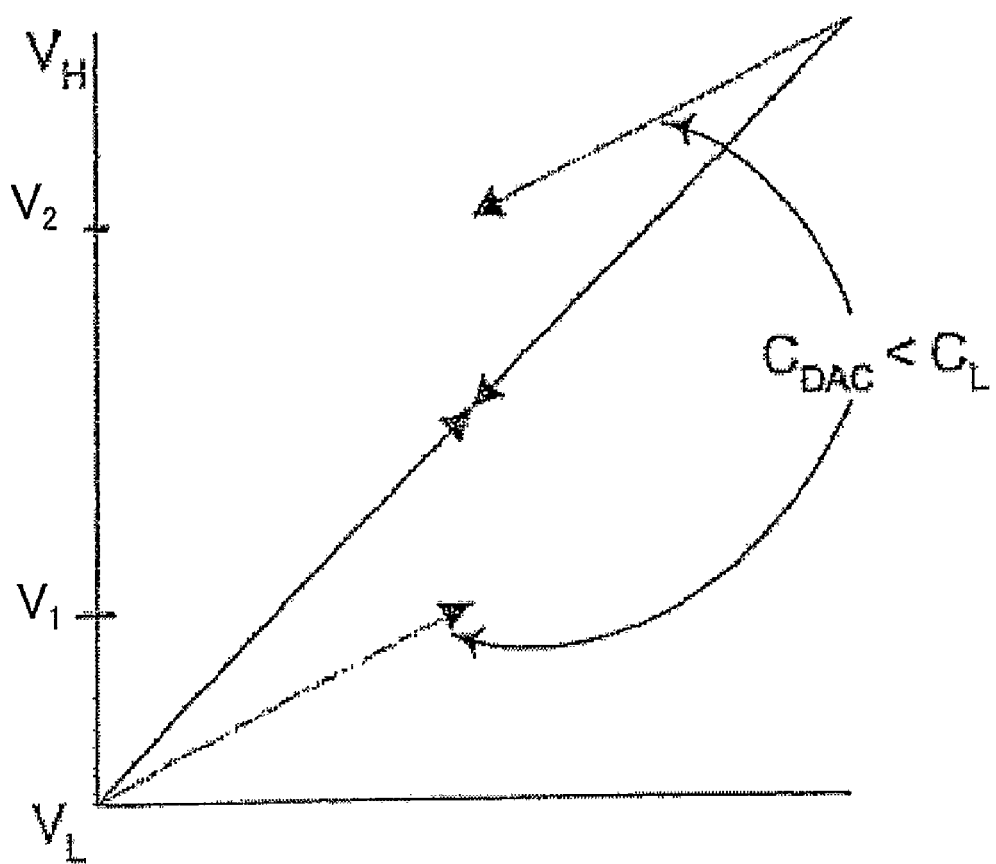

The zeroing phase 11 is followed by a decoding phase 12. During the decoding phase 12, if the internal capacitance Of the converters 6, 6' is greater than their respective Load capacitances, the output voltage from the first converter 6 ($V_{011...11}$) will be greater than the output voltage ($V_{100...00}$) from the second converter 6', as shown in FIG. 4. As a result, the inputs of the comparator 8 have $V_+>V_−$ in the decoding phase 12, and a logic 1 state is generated at the output of the comparator 8. The counter therefore advances from 00 . . . 00 to 00 . . . 01, and the first capacitance $C_1$ of each capacitor network 7, 7' is connected to the output of the network, and thus to the respective load capacitance, through closing of the respective switch.

The decoding phase 12 is followed by a further zeroing phase 11a. This, in turn, is followed by a further decoding phase 12a. In the second decoding phase 12a, the load capacitance of each converter 6,6' is now slightly greater than in the initial decoding phase 12, since the first capacitance $C_1$ of the switched capacitor networks now contributes to the effective load of each converter 6,6'. The output voltage from the first converter 6 is therefore reduced, compared to its output voltage in the first decoding phase 12, and the output voltage from the second converter 6' is increased, again relative to its output voltage in the first decoding phase 12. FIG. 7 illustrates a case where the output level from the first converter is still greater than the output voltage level from the second converter during the second decoding phase 12a, so that the relation $V_+>V_−$ still applies for the comparator inputs. In the second decoding phase 12a, the comparator again outputs a logic 1 state and the counter again advances by 1. This results to the next capacitor of the switched capacitor networks 7, 7' being connected to the output of the network, and thus to the respective load capacitance, through closing of the respective switch.

The zeroing phase and decoding phase are then repeated alternately. In each decoding phase, the effective load capacitance of the converters 6, 6' is slightly larger than in the previous decoding phase, as further capacitors of the capacitor networks 7, 7' are connected to the output of the capacitor networks and thereby contribute to the effective load of the converters. The voltage output from the first converter 6 therefore is slightly smaller in each decoding phase than in the previous decoding phase, while the voltage output from the second converter 6' is slightly greater in each decoding phase than in the previous decoding phase. Eventually, when sufficient capacitors of the capacitor networks 7, 7' have been connected to the output of the capacitor networks and thereby contribute to the load, the voltage output from the first converter 6 in a decoding phase will be lower than the voltage output from the second converter in that decoding phase. In FIG. 7 this is shown as occurring in the fourth decoding phase 12d. In the fourth decoding phase 12d, the comparator will not give a logic 1 state at its output, since the comparator inputs will see $V_+$ is less than $V_−$ during the decoding phase as well as during the zeroing phase. The counter therefore does not advance further, and stores its current value. The state of the capacitor networks 7, 7' is not altered during the decoding phase 12d.

The calibration process illustrated in FIG. 7 has therefore "calibrated" the two converters 6, 6' of the converter arrangement of FIG. 6. The calibration process has increased the load capacitance of each converter until, for each converter 6,6', the respective load capacitance is slightly greater (or possibly equal) to the internal capacitance of the converter. Each converter will have, after completion of the calibration phase of operation, an output characteristic that is very similar to the ideal characteristic of FIG. 3.

The time taken for the calibration phase of operation will be, at greatest, the time required to cycle through all $2^m$ possible input codes for the switch converter networks, 7, 7' although the counter may not advance after a certain stage. The duration of the calibration phase depends on the time taken for one cycle of the converters and on the number of bits in the switched capacitor networks. In a typical implementation, in which the converter arrangement is embodied in a display, the time taken to complete the calibration phase of operation is likely to be of the order of the time taken to write one line of data to the display. (The time taken to write one line of data to a display is dependent on factors such as the frame rate of the display and the number of rows but, for a typical current small display, is likely to be around 50 μsec).

The accuracy of the calibration (that is, the accuracy to which the effective value of the load capacitance can be matched to the internal capacitance of the converter) is determined by the resolution of the switchable capacitor networks 7, 7'. In a case where the capacitors of the capacitor network are arranged so that $C_i = a^{i-1} C_1$ the resolution of the capacitor networks may be increased by decreasing the value of the first capacitance $C_1$. However, this may entail increasing the number of capacitors in each network, in order to ensure that the maximum available capacitance of the capacitor networks 7, 7' is sufficiently great to ensure matching the load capacitance to the capacitance of the converters.

The LSB of the converters may be the same as the LSB of the switch capacitor networks 7, 7', but this is not a requirement. Making the LSB of the switch capacitor networks 7, 7' the same as the LSB of the converters has the advantage that the resolution required in the switch capacitor networks 7, 7' is no greater than the resolution required elsewhere in the converter arrangement. Alternatively, however, the LSB of the switch capacitor networks 7, 7' may be made smaller than the LSB of the converters to allow closer matching of the midpoints in a high accuracy, low resolution system.

Figure 8:
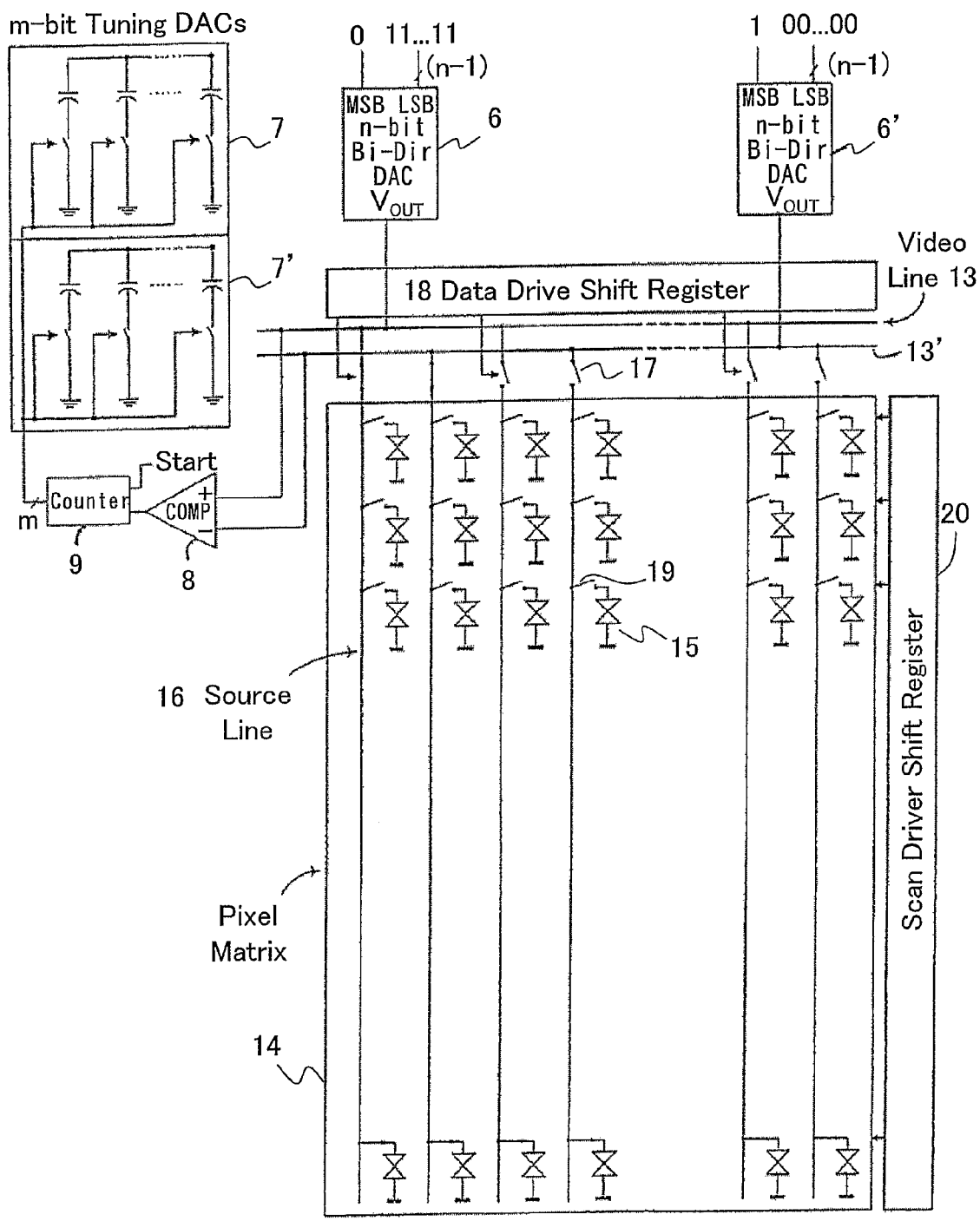
FIG. 8 is a block schematic diagram showing the digital-to-analogue converter arrangement of FIG. 6 embodied in an active matrix display.

FIG. 8 illustrates a typical implementation of the converter arrangement of the present invention. In this implementation, the converter arrangement is embodied in an active matrix display. In FIG. 8, the converter arrangement comprises bi-directional digital-to-analogue converters 6, 6', each connected to a respective video line 13, 13' (which runs the width of the display) for receiving a video input.

An active matrix display 14 comprises pixels 15 arranged in a matrix of row. and columns. The pixels are addressed by means of source lines 16 and scanning lines (not shown) as is conventional. Each video line 13, 13' is connected to every other source line, via switches 17 controlled by a data shift register 18. Each source line 16 is connected to all the pixels 15 in one column, via switches 19 controlled by a scan driver shift register 20.

The display of FIG. 8 is provided with the switchable capacitor networks 7, 7', the comparator 8 and the counter 9 of the converter arrangement shown in FIG. 6. The $V_+$ input of the comparator is connected to the video line 13 and thus to the output of the first converter 6, and the $V_-$ input of the comparator is connected via the second video line 13' to the output of the second converter 6'.

During normal operation of the display, the scan driver shift register 20 sequentially connects each row of pixels 15 to their respective source lines 16. During the time of one such connection, the data driver shift register sequentially connects the video lines 13, 13' to pairs of the source lines 16, charging the pixels 15 two-by-two along each row. FIG. 8 shows the display at a time when each pixel in the lowermost row of pixels is connected to its respective source line and all other pixels are disconnected from their respective source line. Furthermore, the left hand-most pair of source lines are connected to their respective video lines 13, 13', and all other source lines are disconnected from the video lines.

The load capacitance thus seen by each converter 6, 6' is thus a combination of the parasitic capacitance of one video line, the parasitic capacitance of one source line, the gate-drain capacitances of all open data driver switches 17 and open pixel switches 19, and the capacitance of the pixel being charged. It is assumed that the load seen by a converter 6, 6' will be substantially the same regardless of which source line, and which pixel, the converter is connected to.

During the calibration phase of operation, the data driver shift register and the scan driver shift register are arranged so that a single row of pixels is connected to the source lines and so that one source line is connected to each video line. These connections are maintained throughout the calibration phase operation. This ensure that the load generated by the display panel during the calibration phase will be substantially the same as the load generated by the display during normal operation.

The converter arrangement of the invention may be embodied in any active matrix display such as, but not limited to, a liquid crystal active matrix display.

If the two converter/load pairs in the converter arrangement of FIG. 6 are not nominally identical to one another, it would be necessary to add a different amount of capacitance to the load of each converter. While this is possible in principle, there would no longer be a unique solution to the calibration. More capacitance might be added to the load of the converter receiving, in the calibration phase, the 100 . . . 00 input code than to the load of the converter receiving, in the calibration phase, the 011 . . . 11 input, so that the two arms of the output voltage characteristic would meet at a point other than the mid-point. When the converters were used, one converter would display missing output voltages (that is, there would be some output voltages that were not obtained by any input code) and the other converter would display repeated output voltages (that is, there would be some output voltages that were obtained by two or mode different input codes), so that neither converter would be correctly tuned. The two converters 6, 6' in the converter arrangement of FIG. 6 are therefore preferably nominally identical to one another. The converter arrangement of FIG. 6 is also preferably embodied with the load capacitances $C_{LOAD}$, $C_{LOAD'}$ being substantially equal to one another. This will be the case when the converter arrangement is, for example, embodied in an active matrix display as in FIG. 8 since, as explained above, the capacitive load of the two converters is substantially equal in FIG. 8. However, in principle, the two loads need not be equal to one another, and the two converters need not be nominally identical to one another.

Figure 9:
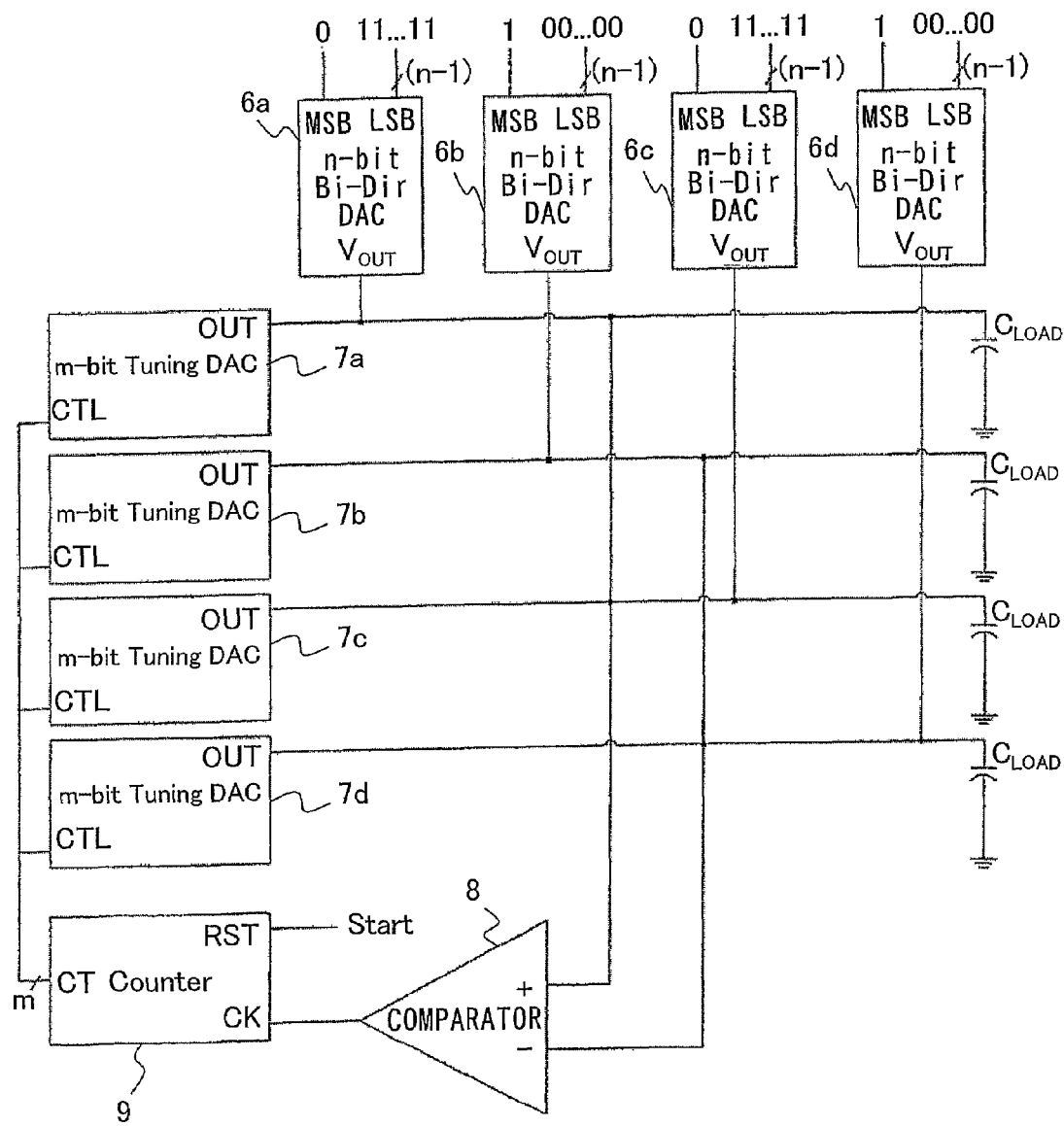
FIG. 9 is a block schematic circuit diagram of a digital-to-analogue converter arrangement of a second embodiment of the present invention.

In the embodiment of FIG. 6 each group of converters Comprises a single converter. The invention is not, however, limited to this, and FIG. 9 shows a second embodiment of the invention in which each group of converters includes two converters. Converters 6a and 6c form one group, and converters 6b, 6d form a second group. The outputs of converters in a group are connected together during the calibration phase. The converters 6a, 6c of the first group receive a first input code, and the converters 6b, 6d of the second group receive a second, different, input code.

The output of each of the converters 6a-6d is connected to a respective capacitive load. The output of each converter 6a-6d is also connected to a respective switchable capacitor network of m capacitors similar to the capacitor networks 7, 7' of the embodiment of FIG. 6.

The converter arrangement 33 of FIG. 9 comprises a comparator 8, having $V_+$ and $V_-$ inputs. The $V_+$ input is connected to the outputs of the converters 6a, 6c of the first group, and the $V_-$ input is connected to the outputs of the converters 6b, 6d of the second group of converters. The output of the comparator is connected to an m-bit counter 9, whose output controls the m-bit tuning converters 7a-7d.

The converter arrangement of FIG. 9 operates in substantially the same manner as the converter arrangement of FIG. 6, except that the $V_+$ input to the comparator 8 is the average of the output of the two converters 6a, 6c of the first group, and that the V input to the comparator 8 is the average of the outputs from the converters 6b, 6d of the second group. The converters are preferably arranged so that their internal capacitance is greater than the largest load capacitance that can be expected, and the capacitors of each switched capacitor networks are connected to the output of the network so as to make the overall load capacitance experienced by a converter equal, or substantially equal, to the internal capacitance of the converters. The calibration of the converter arrangement of FIG. 9 corresponds generally to the process described with reference to FIG. 7 above, and will therefore not be described in detail.

A converter arrangement of the general form of FIG. 9 may be embodied having any even number of bi-directional digital-to-analogue converters, with the converters arranged in two groups with an equal number of converters in each group.

Figure 10:
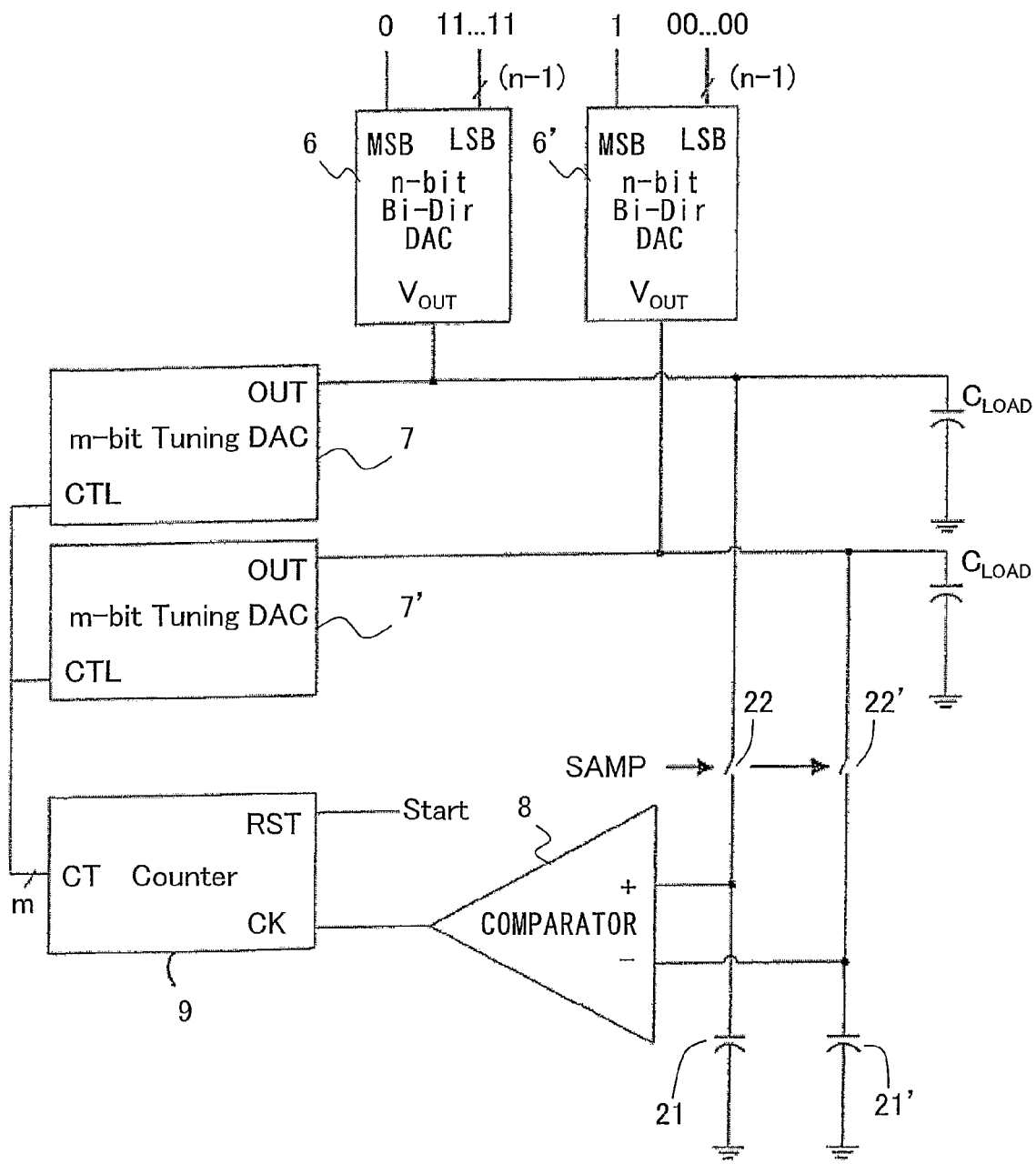
FIG. 10 is a block schematic circuit diagram of a digital-to-analogue converter arrangement of a third embodiment of the present invention.

FIG. 10 shows a converter arrangement 33 according to a third embodiment of the invention. This corresponds generally to the first embodiment of FIG. 6, and only the differences will be described.

In the embodiment of FIG. 10, a sample-and-hold circuit is provided in each input to the comparator 8. In FIG. 10, the sample-and-hold circuits are formed by capacitors 21, 21' connected to the $V_+$ and $V_-$ inputs of the comparator 8, respectively. A switch 22 is provided between the $V_+$ input of the comparator 8 and the output of the first converter 6, and a second switch 22' is provided between the $V_+$ input of the comparator 8 and the output of the second converter 6'.

In the embodiment of FIG. 10, the output voltages from the converters 6, 6' may be sampled and held in the capacitors 21, 21' by operating the switches 22, 22' appropriately. For example, the switches 22, 22' may be opened and closed by means of a sampling control signal SAMP applied to the switches. The sampled outputs from the converters are held at the inputs of the comparator, and this may increase the time available for the comparator to react to the input voltages.

In FIG. 10, the sampling capacitors 21, 21' are shown as separate components. However, if the inputs of the comparator 8 have a sufficiently high parasitic capacitance, it may be possible to use the parasitic capacitance of the inputs as the sampling capacitors and thus avoid the need to provide separate sampling capacitors.

Figure 11:
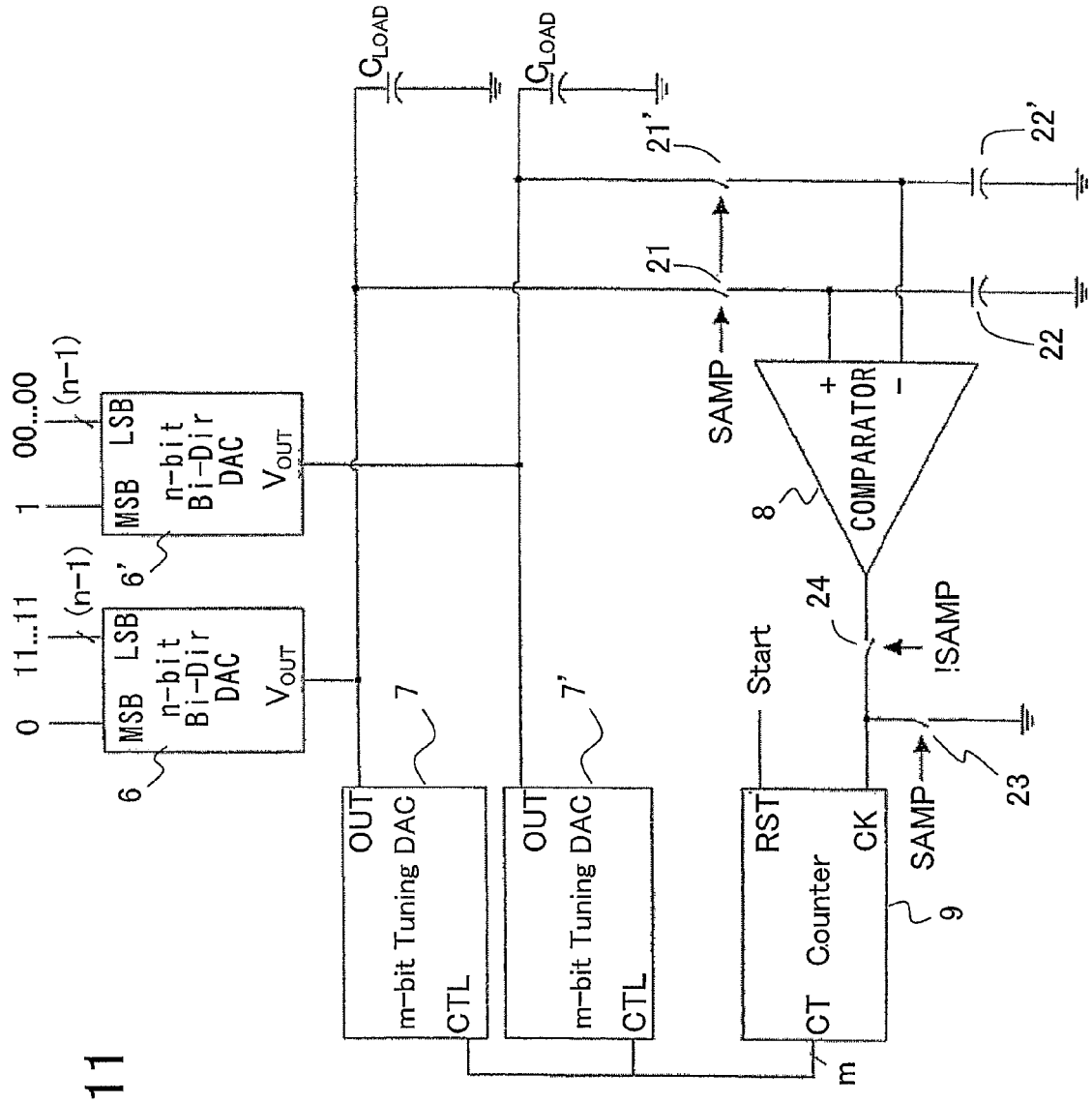
FIG. 11 is a block schematic circuit diagram of a digital-to-analogue converter arrangement of a fourth embodiment of the present invention.

FIG. 11 shows a converter arrangement 33 according to a further embodiment of the present invention. This corresponds generally to the converter arrangement of FIG. 10, and only the differences will be described.

In the converter arrangement of FIG. 11, a pull-down circuit is provided between the output of the comparator 8 and the clock input CK of the counter 9. In FIG. 11, the pull-down circuit comprises a first switch 23 that connects the clock input of the counter to earth, and a second switch 24 that selectively connects the output of the comparator to the clock input of the counter. The first switch 23 is opened and closed by the sampling control signal SAMP that controls the sampling switches 21, 21'. The second switch 24 is controlled by the inverse (!SAMP) of the sampling signal. In the converter arrangement of FIG. 9, the CK input of the counter 9 is held low during sampling of the output voltages from the converters 6, 6'. Otherwise, the clock input of the counter 9 is connected to, and follows the output of the comparator 8.

A typical counter 9 will react only to a rising edge of a pulse supplied to its clock input CK. Providing the pull-down circuit ensures that the clock input is made low once every cycle, thereby ensuring reliable detection of a pulse at the clock input CK of the comparator.

Figure 12:
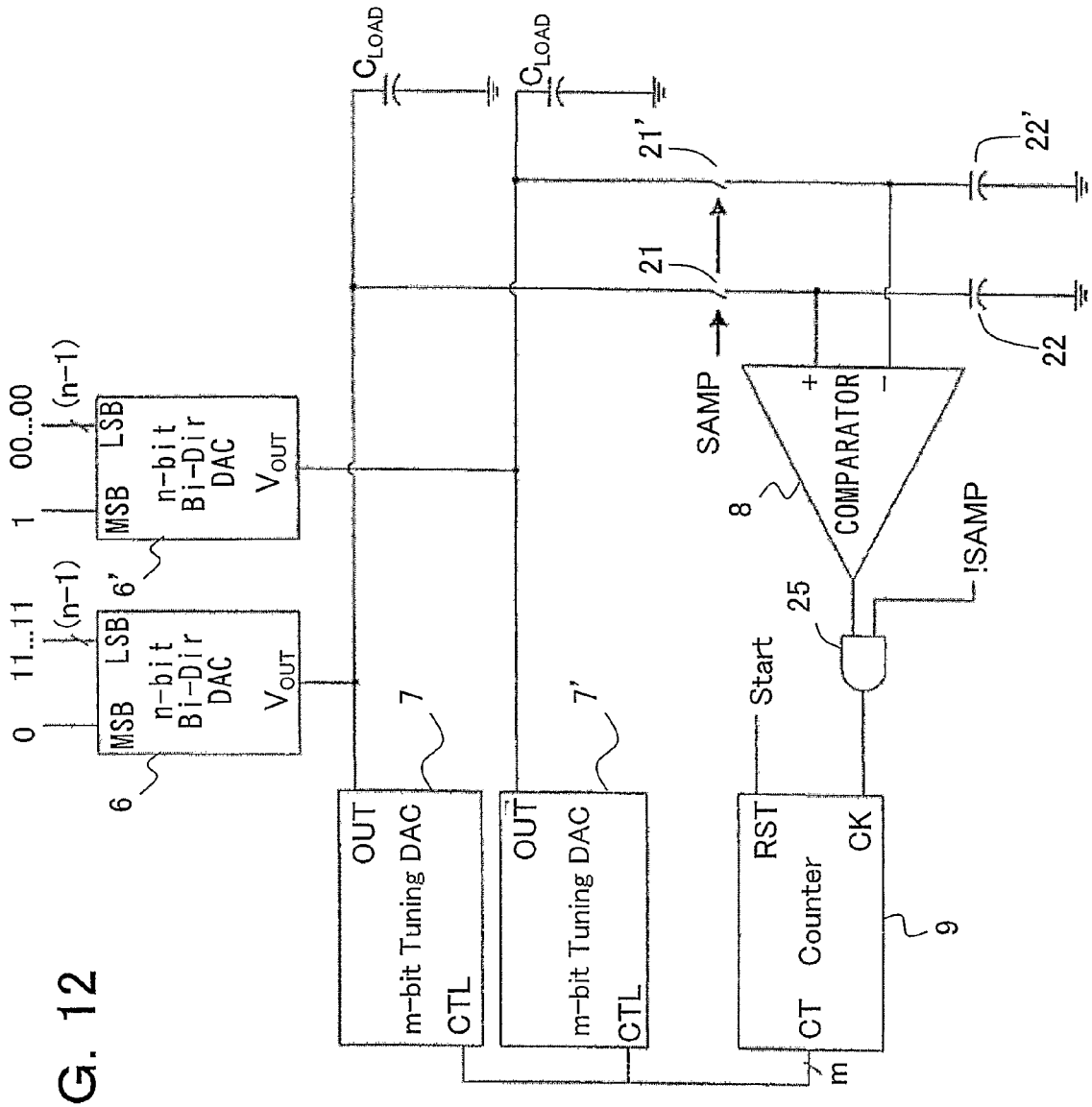
FIG. 12 is a block schematic circuit diagram of a digital-to-analogue converter arrangement of a fifth embodiment of the present invention.

FIG. 12 shows a converter arrangement 33 according to a further embodiment of the present invention. This embodiment generally corresponds to the embodiment of FIG. 11, in that a pull-down circuit is provided to pull down the clock input CK of the counter 9. In the converter arrangement of FIG. 12, however, the pull-down circuit is provided by an AND gate 25. The output of the comparator 8 is input to one input of the AND gate 25, and the inverse of the sampling control signal is input to the second input of the AND gate. During a sampling operation the output of the AND gate 25 is low and thus holds the CK input of the counter 9 low. At other times, the CK input of the counter 9 follows the output of the comparator 8.

The embodiments of FIGS. 10, 11 and 12 have been described with reference to a converter arrangement in which each group of converters comprises only one converter. These embodiments may, however, be applied to converter arrangements in which each group of converters comprises more than one converter.

Figure 13:
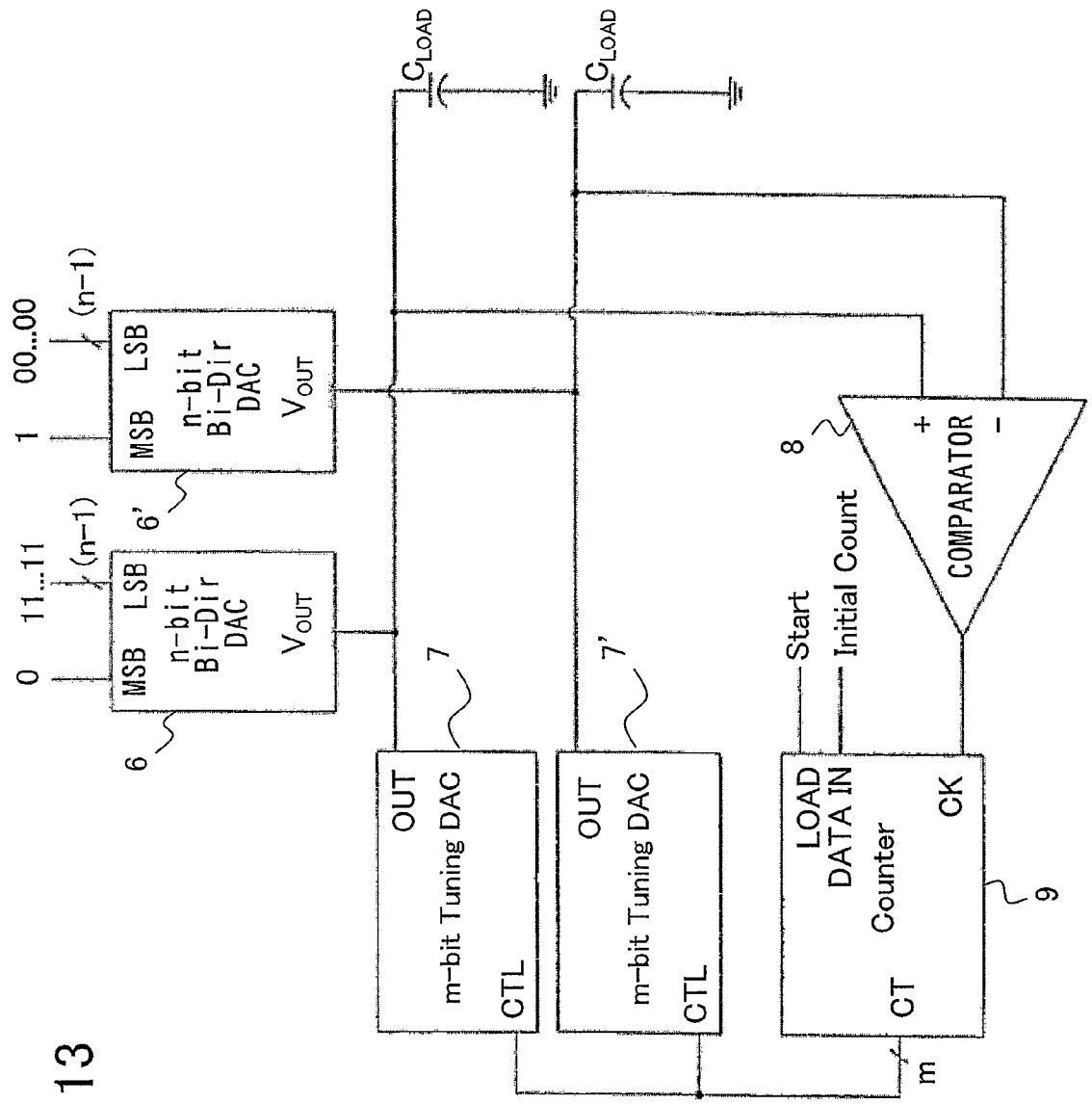
FIG. 13 is a block schematic circuit diagram of a digital-to-analogue converter arrangement of a sixth embodiment of the present invention.

FIG. 13 shows a converter arrangement 33 according to a further embodiment of the present invention. This arrangement again corresponds generally to the converter arrangement of FIG. 6, and only the differences will be described.

In the embodiment of FIG. 13, the counter 9 is a pre-loadable counter. Compared with the counters 9 of the previous embodiments, the counter 9 of FIG. 13 has a third input DATA IN that allows a user to load a desired initial count value into the counter. This has the advantage that it is not necessary to carry out the entire calibration process starting from a counter output of 00 . . . 00. This is particularly useful when the user has an approximately idea of the difference between the capacitance of the converters 6, 6' and the load capacitance.

The embodiment of FIG. 13 has been described with reference to a converter arrangement in which each group of converters comprises only one converter. This embodiment may, however, be applied to converter arrangements in which each group of converters comprises more than one converter. The embodiment of FIG. 13 may also be applied a converter arrangement having a sample-and-hold circuit or to a converter arrangement having a sample-and-hold circuit and a pull-down circuit.

Figure 14:
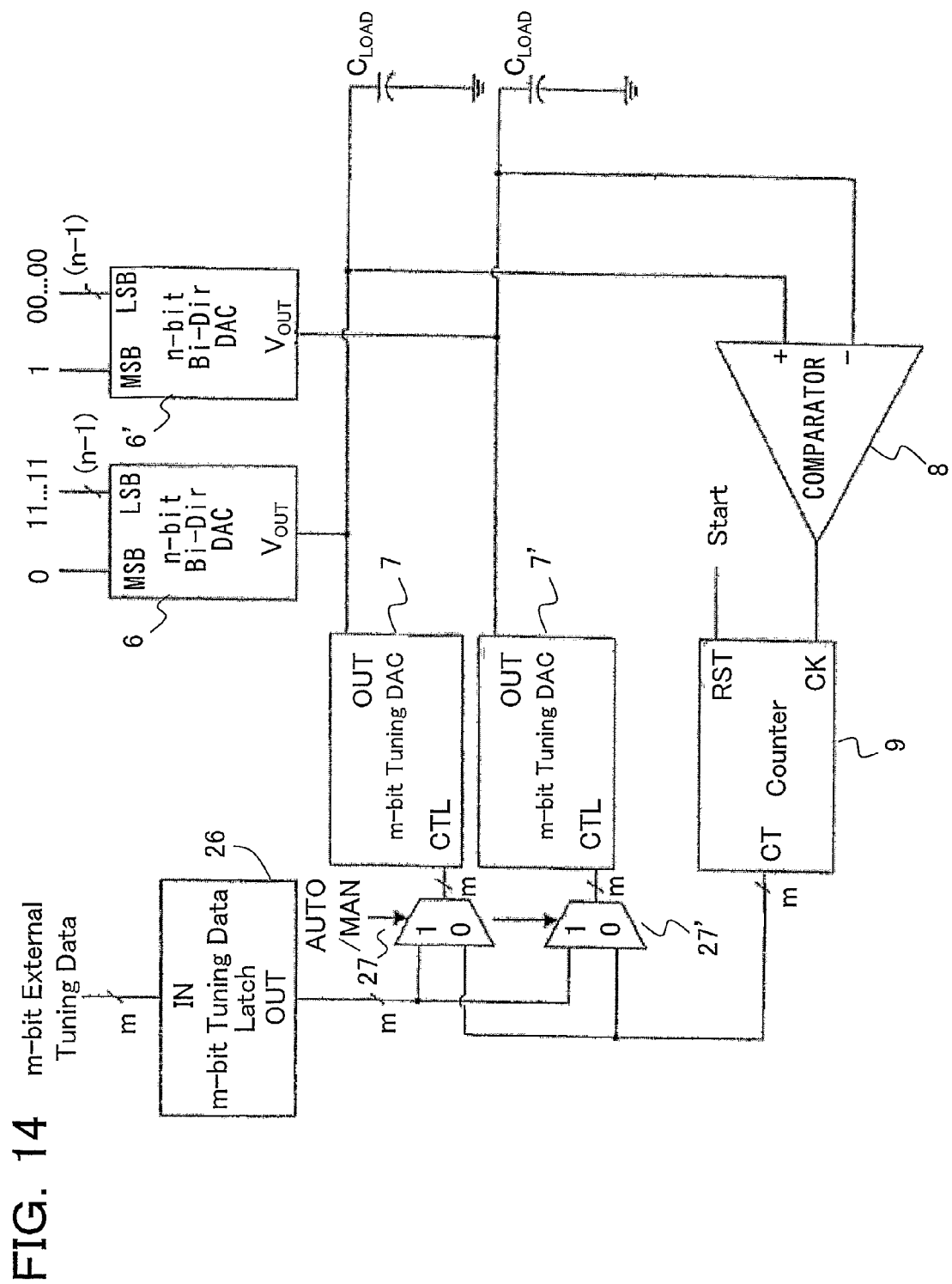
FIG. 14 is a block schematic circuit diagram of a digital-to-analogue converter arrangement of a seventh embodiment of the present invention.

FIG. 14 shows a converter arrangement 33 according to a seventh embodiment of the present invention. This embodiment again corresponds generally to the embodiment of FIG. 6, and only the differences will be described.

In the embodiment of FIG. 14, the switchable capacitor networks 7, 7' are connectable to a data latch so that a user can override the control circuit and can manually input tuning data into the switchable capacitor networks 7, 7'.

In the embodiment of FIG. 14, an m-bit tuning data latch 26 is provided, with the output of the data latch 26 being connectable to the inputs of the switchable capacitor networks 7, 7'. The output of the counter 9 is also connectable to the inputs of the switchable capacitor networks 7, 7'. Control of which signal is input to the capacitor networks is achieved by means of selector switches 27, 27' which each receive an input from the data latch 26 and an input from the counter 9, and select one of the inputs for onwards transmission to the input of the respective capacitor networks 7, 7'. In the embodiment of FIG. 14, the selectors 27, 27' are shown as controllable by an AUTO/MAN control signal that selects either manual operation or automatic operation (when the capacitor networks are controlled by the control circuit)—when the AUTO/MAN control signal has a logic 1 state it selects the output of the data latch 26 and passes that to the capacitor network 7, 7' thereby allowing manual control of the capacitor networks, whereas when the AUTO/MAN control signal has a logic 0 state the selector 27, 27' selects the output from the counter 9 and passes that to the capacitor network 7, 7'.

The embodiment of FIG. 14 is of use when the user has an exact knowledge of the difference between the capacitance of the converters 6, 6' and the respective load capacitance. This embodiment is also of use for testing since, by applying two or more different tuning codes to the tuning data latch 26, the effect of different tuning codes can be observed. This embodiment is further of use where the converter arrangements can be tuned at manufacture and the correct tuning code can be stored elsewhere in the system for loading into the tuning data latch when the converter arrangement is powered up.

Figure 15:
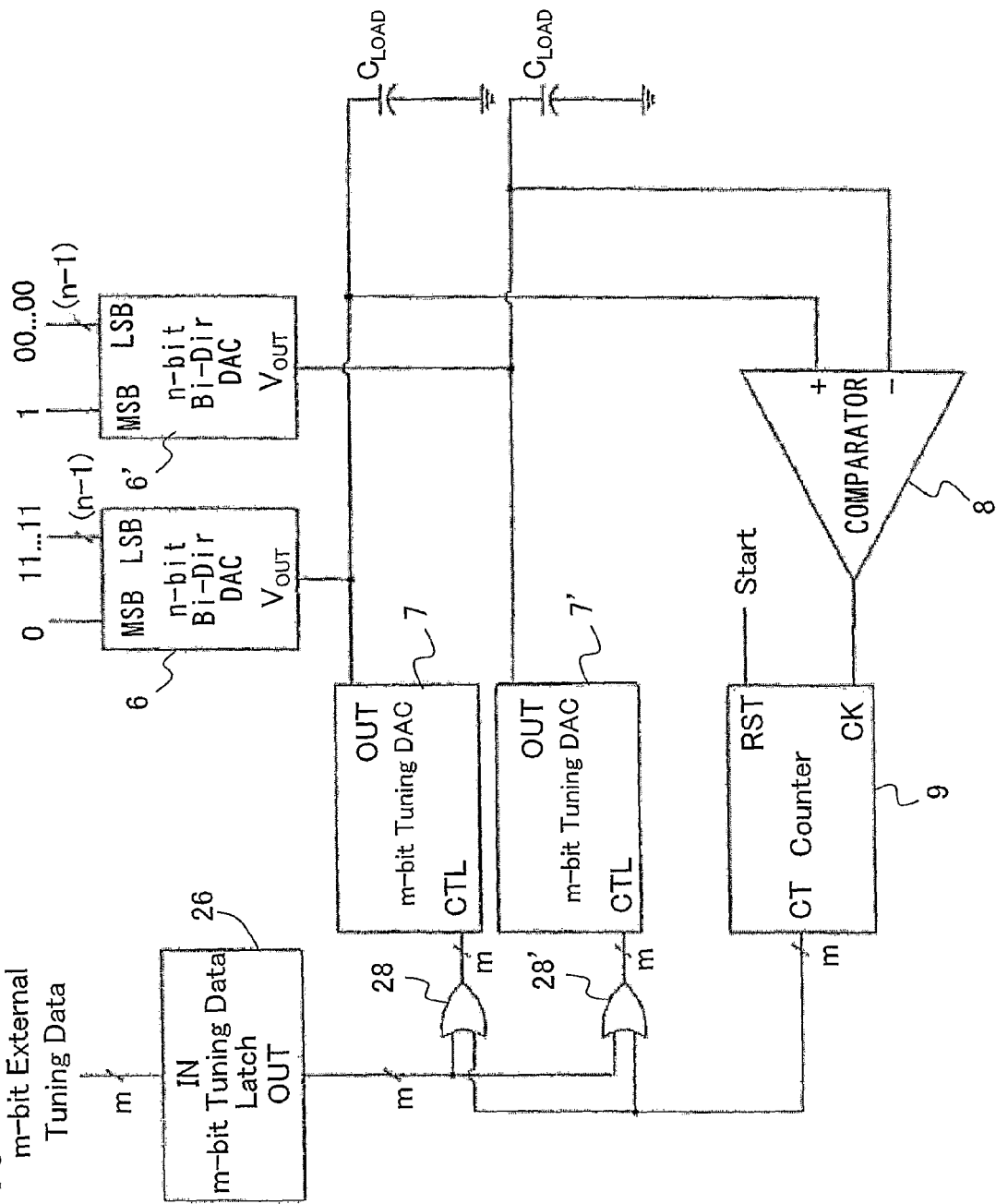
FIG. 15 is a block schematic circuit diagram of a digital-to-analogue converter arrangement of a eighth embodiment of the present invention.

FIG. 15 shows a converter arrangement 33 according to a further embodiment of the present invention. This corresponds generally to the embodiment of FIG. 14, in that the capacitor networks 7, 7' are again connected to a data latch 26 to allow a user to input data direct to the capacitors 7, 7'. In the embodiment of FIG. 15, the externally applied data is passed to the capacitor networks 7, 7' by means of respective OR gates 28, 28'. In this embodiment, it is necessary for the counter 9 to be re-set so that the output of each bit of OR gate is equal to the corresponding bit of the data applied by the data latch 26.

The embodiments of FIGS. 14 and 15 have been described with reference to a converter arrangement in which each group of converters comprises only one converter. These embodiments may, however, be applied to converter arrangements in which each group of converters comprises more than one converter. The embodiments of FIGS. 13 and 14 may also be applied a converter arrangement having a sample-and-hold circuit or to a converter arrangement having a sample-and-hold circuit and a pull-down circuit.

In the calibration phase described in FIG. 7, the voltage levels used in the calibration phase, $V_H$, $V_L$, are the same as the voltages used in the normal operation of the converters 6, 6'. The invention, however, does not require this, and it is possible for the reference voltages to be used in the calibration phase to be different from those used in the normal operation of the converters. For example, choosing different voltages, $V_{H'}$, $V_{L'}$ during the calibration phase, such that $V_{H'}-V_{L'}$ is greater than $V_H-V_L$, will increase the absolute value of the difference between the voltages at the comparator inputs (although the sign of the voltages difference will be unchanged), and this enables a less precise comparator to be used.

Figure 16:
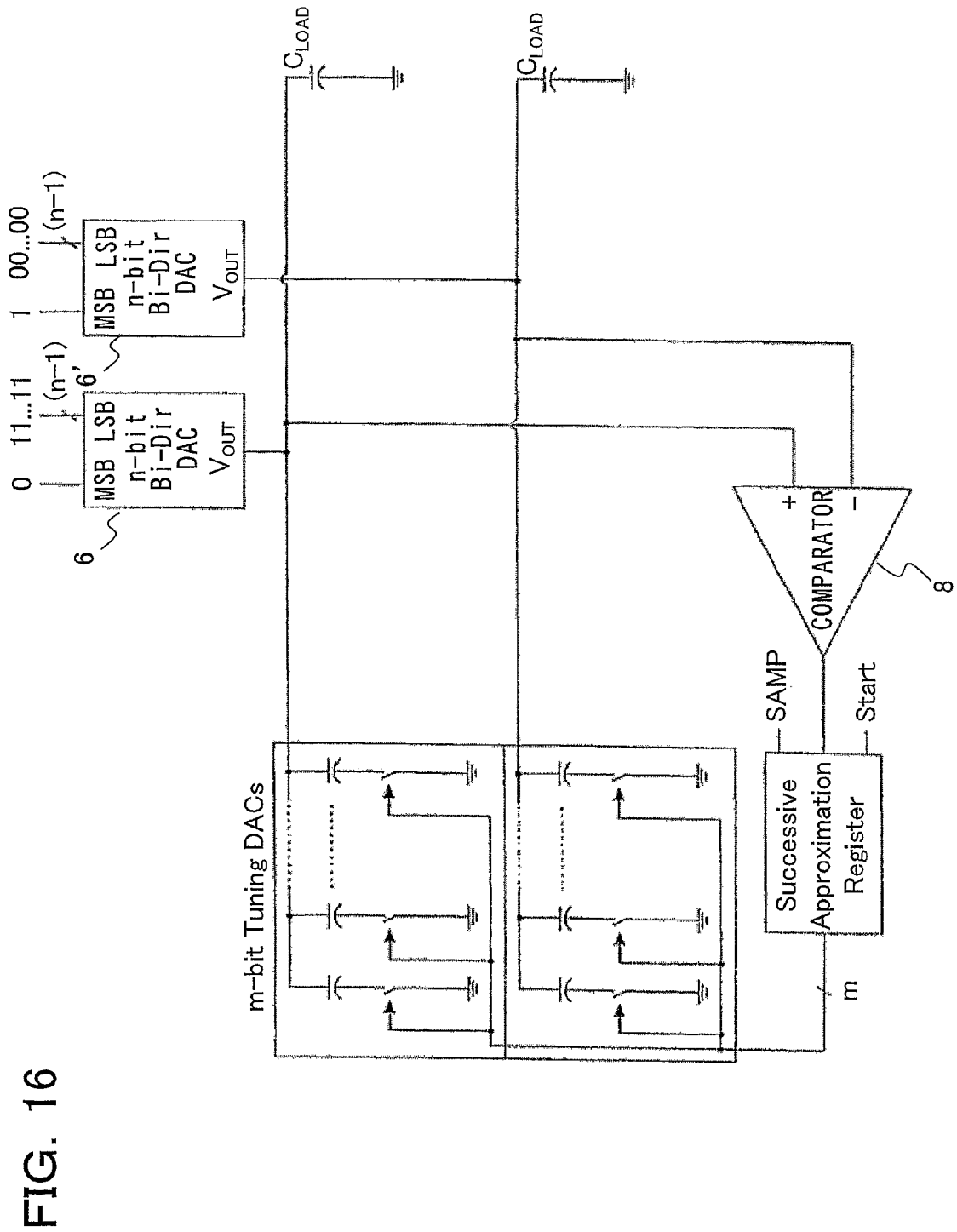
FIG. 16 is a block schematic circuit diagram of a digital-to-analogue converter arrangement of a ninth embodiment of the present invention.

In the embodiments described above the control circuit comprises a counter. The invention may alternatively be embodied using a control circuit that comprises a successive approximation register. FIG. 16 is a block schematic diagram of a converter arrangement 34 according to another embodiment of the invention having a control circuit that comprises a successive approximation register.

The converter arrangement 34 of FIG. 16 corresponds generally to the converter arrangement 33 of FIG. 6 and comprises first and second groups of bi-directional bufferless digital-to-analogue converters 6,6'. Each converter 6,6' may be, for example, a switched capacitor converter and have the general form of the bi-directional bufferless converter of FIG. 2. Each group contains the same number of bufferless bi-directional digital-to-analogue converters 6,6'; in the embodiment of FIG. 16 each group contains one converter, although the embodiment is not limited to groups of only one converter. The output of each digital-to-analogue converter 6,6' is connected to a respective capacitive load. The internal capacitance of each bi-directional, bufferless digital-to-analogue converters 6, 6' is set to be larger than the largest possible value of the respective load capacitance $C_{LOAD}$, $C_{LOAD'}$.

The converter arrangement 34 of FIG. 16 further comprises first and second switched capacitor networks 7, 7'. The first switched capacitor network 7 is connected to the output of the first converter 6, and the output of the second capacitor network 7' is connected to the output of the second converter 6'. The switched capacitor networks 7, 7' correspond to the switched capacitor networks of FIG. 6, and their description will not be repeated.

The converter arrangement further comprises a comparator 8. The output from one converter 6 is connected to the + input of the comparator and the output of the other converter 6' is connected to the − input of the converter. As in the embodiment of FIG. 6, the comparator is arranged to give a logic 1 state at its output if $V_+$ is greater than $V_-$ (where $V_+$ denotes the input voltage at the + input terminal and $V_-$ denotes the input voltage at the − input terminal). Otherwise, the comparator outputs a logic 0 state.

The converter arrangement of FIG. 16 further comprises a control circuit for controlling the switched capacitor networks 7,7' on the basis of the output of the comparator 8. In the embodiment of FIG. 16, the control circuit comprises an m-bit (or higher) successive approximation register 35. The output from the comparator 8 is connected to the input of the successive approximation register 35. The output of the successive approximation register 35 controls the switches 29,29' of the switched capacitor networks 7,7'.

The operation of the successive approximation register 35 is synchronised to the operation of the converters by a timing signal. The timing signal is applied to a second input, labelled SAMP in FIG. 16, of the successive approximation register. The timing signal may be the same timing signal as used in the embodiments of FIGS. 10, 11 and 12. The successive approximation register 35 must have some form of external timing input, since it must react to the output state of the comparator which may be either logic "1" or logic "0". (In embodiments which use a counter, the counter has to react only to a logic "1" output from the comparator).

In the calibration phase the successive approximation register 35 must initially output the code 100 . . . 00, which is the midpoint of the output of the successive approximation register (and corresponds to the capacitance of the switched capacitor networks 7,7' being set at its midpoint in the case of binary-scaled capacitors where $C_i = a^{(i-1)} C_1$). The successive approximation register 35 is provided with a third input, labelled START in FIG. 16, to allow a signal to be applied to the successive approximation register 35 to set it to give an output of 100 . . . 000. Thus, the successive approximation register introduces capacitance starting with the most significant bit (MSB)—that is, by switching in the highest-value capacitance (the capacitance $C_m$ in the case of binary-scaled capacitors where $C_i=a^{(i-1)}C_1$).

If the comparator generates a logic 1 output the next time the converters decode (i.e. if the output curves of the two comparators cross as shown at 12a in FIG. 7), the MSB of the output from the successive approximation register is kept at logic 1, and the highest-value capacitance of the capacitor networks 7,7' remains switched in. The next highest value capacitance will also be switched in, by setting the next most significant bit (the second most significant bit) of the output from the successive approximation register to logic 1.

However, if the comparator generates a logic 0 output the next time the converters decode, the MSB of the output from the successive approximation register is set to logic 0, and the highest-value capacitance of the capacitor networks 7,7' is switched out. The next (second) most significant bit of the output from the successive approximation register will be set to logic 1, and the second highest-value capacitance will be switched in.

Thus, the next output from the successive approximation register will be 110 ... 000 or 010 ... 000. These correspond to three-quarters and one quarter of the output range of the successive approximation register (and correspond to the capacitance of the switched capacitor networks 7,7' being set at three-quarters or one quarter of its maximum in the case of binary-scaled capacitors where $C_i=a^{(i-1)}C_1$). The possible range of output codes for the successive approximation register has been halved. Initially the range for the output code was from 000 ... 000 to 111 ... 111 and the midpoint 100 ... 000 was used as the first approximation. Depending on the output from the comparator, the range for the output code of the successive approximation register that sets the capacitance of the switched capacitor networks such that the overall load capacitance is equal to the internal capacitance of the converters is now known to be from 000 ... 000 to 100 .... 000 or from 100 ... to 111 ... 111, and the code 010 ... 000 or 110 ... 000 is used as the next approximation.

The next time the converters decode, the value of the second most significant bit will be maintained at logic 1 or set to logic 0, depending on the output from the comparator, and the second highest value capacitance of the switched capacitor networks will be kept switched in or will be switched out accordingly. The next most significant bit of the output of the successive approximation register will be set to logic 1 to switch in the next highest capacitance. These steps are then repeated for the next most significant bit, and so on. The range of possible output codes for the successive approximation register is halved at each step.

The final output code produced by the successive approximation register will set the switched capacitance networks to give the highest possible capacitance that is needed to keep $V_{011...11} > V_{100...00}$ (so that the two output voltage curves just cross, as in region 12c of FIG. 7). In contrast, an embodiment using a counter will set the switched capacitance networks to give the lowest possible capacitance that is needed to make $V_{011...11} < V_{100...00}$ (so that the two output voltage curves do not cross, as in region 12d of FIG. 7). The capacitance of the switched capacitance network set in an embodiment using a successive approximation register will therefore be one least significant bit (LSB) lower than the capacitance of the switched capacitance network set in an embodiment using a counter. Both embodiments may be regarded as giving good calibration, since ±½ LSB is effectively exact tuning in a digital system. If, however, it is desired for an embodiment using a successive approximation register to achieve exactly the same calibration as the embodiments using a counter, one least significant bit must be added to the final output code produced by the successive approximation register to make $V_{011...11} < V_{100...00}$ as in region 12d in FIG. 7.

FIG. 16 describes use of a successive approximation register in an embodiment corresponding to FIG. 6. All embodiments of the invention described herein may however be implemented with a successive approximation register in place of a counter.

Any converter arrangement of the invention may be embodied in any active matrix display such as, but not limited to, a liquid crystal active matrix display.

The invention claimed is:

1. A digital-to-analogue conversion arrangement comprising: first and second groups of the same number of bi-directional bufferless digital-to-analogue converters, each group comprising at least one converter whose output is connected to a respective capacitive load, the converter inputs being arranged, during a calibration phase of operation, to receive first and second different codes representing the same output level; a respective switched capacitor network connected to each converter output; a comparator for comparing the output voltages of the first and second groups; and a control circuit for controlling the capacitor networks in response to the comparator so as to make the output voltages of the first and second group substantially equal.

2. An arrangement as claimed in claim 1, wherein the converters are substantially identical.

3. An arrangement as claimed in claim 1, wherein the capacitive loads are of substantially the same capacitance.

4. An arrangement as claimed in claim 1, wherein the second code is the binary complement of the first code.

5. An arrangement as claimed in claim 1, wherein the same level is the middle scale level of the converters.

6. An arrangement as claimed in claim 1, wherein the control circuit comprises a counter.

7. An arrangement as claimed in claim 6, wherein the counter is preloadable.

8. An arrangement as claimed in claim 1, wherein the control circuit comprises a successive approximation register.

9. An arrangement as claimed in claim 1, wherein each of the first and second groups comprises one converter.

10. An arrangement as claimed in claim 1, wherein each of the first and second groups comprises a plurality of converters whose outputs are connected together during the calibration phase.

11. An arrangement as claimed in claim 1, wherein each of the capacitor networks is binary weighted.

12. An arrangement as claimed in claim 1, wherein the comparator has inputs connected to the first and second groups via respective sample-and-hold circuits.

13. An arrangement as claimed in claim 1, wherein the capacitor networks are connectable to a latch for a manual calibration mode.

14. An arrangement as claimed in claim 1, wherein each of the converters is a switched capacitor converter.

15. An arrangement as claimed in claim 14, wherein each of the converters has a total capacitance greater than that of the respective load.

16. An arrangement as claimed in claim 14, wherein each of the converters is an n-bit converter, where n is an integer greater than one, comprising: an (n−1) bit bufferless switched capacitor converter having first and second voltage inputs and an (n−1) bit digital input; and (n−1) bit selective inverter for supplying to the (n−1) bit digital input the (n−1) least significant bits without inversion when the most significant bit has a first value and with inversion when the most significant bit has a second value different from the first value; and a switching arrangement for connecting the first and second reference voltage inputs to receive first and second reference voltages, respectively, when the most significant bit has the first value and to receive the second and first reference voltages respectively, when the most significant bit has the second value.

17. An arrangement as claimed in claim 16, wherein the (n−1) bit converter comprises (n−1) capacitors whose first electrodes are connected together for connection to the capacitive load.

18. An arrangement as claimed in claim 17, wherein the second electrode of each $i^{th}$ capacitor is arranged to be connected to the first or second reference voltage input when the $i^{th}$ bit of the (n−1) least significant bits has the first or second value, respectively.

19. An arrangement as claimed in claim 17, wherein the (n−1) bit converter has a resetting mode in which the first and second electrodes of the capacitors are connected to the first reference voltage input.

20. An arrangement as claimed in claim 17, wherein each $i^{th}$ capacitor has a value $C_i$ given by $C_i = a^{(i-1)} C_1$ for $1 < i \leq (n-1)$, where a is a positive real number.

21. An arrangement as claimed in claim 20, wherein a=2.

22. An arrangement as claimed in claim 16, in which the first value is 0.

23. An arrangement as claimed in claim 16, wherein the second reference voltage is greater than the first reference voltage.

24. An active matrix display comprising an arrangement as claimed in claim 1, wherein each of the loads comprises a data line and a pixel.

25. A display as claimed in claim 24, comprising a liquid crystal device.

* * * * *